United States Patent
Tsuda

(10) Patent No.: US 10,388,909 B2
(45) Date of Patent: Aug. 20, 2019

(54) DISPLAY DEVICE, BONDING JIG, BONDING DEVICE, AND STRETCHING JIG USED FOR MANUFACTURING THE DISPLAY DEVICE, AND METHOD FOR MANUFACTURING DISPLAY DEVICE

(71) Applicant: Sharp Kabushiki Kaisha, Sakai, Osaka (JP)

(72) Inventor: Kazuhiko Tsuda, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 18 days.

(21) Appl. No.: 15/543,743

(22) PCT Filed: Jan. 14, 2016

(86) PCT No.: PCT/JP2016/051054
§ 371 (c)(1),
(2) Date: Jul. 14, 2017

(87) PCT Pub. No.: WO2016/114373
PCT Pub. Date: Jul. 21, 2016

(65) Prior Publication Data
US 2018/0006269 A1    Jan. 4, 2018

(30) Foreign Application Priority Data

Jan. 16, 2015  (JP) ................. 2015-006574

(51) Int. Cl.
*H01L 29/18*  (2006.01)
*H01L 33/00*  (2010.01)
(Continued)

(52) U.S. Cl.
CPC ...... *H01L 51/5253* (2013.01); *H01L 51/0097* (2013.01); *H01L 51/5246* (2013.01); *H01L 51/5281* (2013.01); *H01L 51/56* (2013.01); *H01L 27/323* (2013.01); *H01L 27/3244* (2013.01); *H01L 2251/301* (2013.01); *H01L 2251/5338* (2013.01); *H01L 2251/558* (2013.01); *Y02E 10/549* (2013.01)

(58) Field of Classification Search
None
See application file for complete search history.

(56) References Cited

U.S. PATENT DOCUMENTS

2006/0028128 A1* 2/2006 Ohkubo ............. H01L 51/5253
                                                 313/506
2007/0080627 A1* 4/2007 Sakamoto .......... H01L 51/5237
                                                 313/504
(Continued)

FOREIGN PATENT DOCUMENTS

JP  2005-251671 A  9/2005
JP  2011-513944 A  4/2011
(Continued)

*Primary Examiner* — Calvin Y Choi
(74) *Attorney, Agent, or Firm* — ScienBiziP, P.C.

(57) ABSTRACT

Provided is a display device 100 that includes a display panel having flexibility (an organic EL panel 1 as an example), and an optical member 2 having flexibility, arranged so as to be stacked on the display panel, wherein the display panel and the optical member 2 are stacked and bonded in a bent state, and thereafter stretched into a flat shape.

7 Claims, 6 Drawing Sheets

(51) Int. Cl.
     *H01L 51/52*     (2006.01)
     *H01L 51/00*     (2006.01)
     *H01L 51/56*     (2006.01)
     *H01L 27/32*     (2006.01)

(56) References Cited

U.S. PATENT DOCUMENTS

2012/0118488 A1*   5/2012   Umemoto ........... B32B 37/0015
                                                                          156/182
2014/0312339 A1*  10/2014   Fujita ................... H01L 27/322
                                                                         257/40

FOREIGN PATENT DOCUMENTS

WO        2005/027582 A1    3/2005
WO        2009/114242 A1    9/2009

\* cited by examiner

Bonding third sheet and subsequent sheets

US 10,388,909 B2

DISPLAY DEVICE, BONDING JIG, BONDING DEVICE, AND STRETCHING JIG USED FOR MANUFACTURING THE DISPLAY DEVICE, AND METHOD FOR MANUFACTURING DISPLAY DEVICE

TECHNICAL FIELD

The present invention relates to a display device having flexibility, and a bonding jig, a bonding device, and a stretching jig used for manufacturing the display device, as well as a method for manufacturing a display device.

BACKGROUND ART

As a technique used for an organic EL display device in which organic electroluminescence (EL) elements are used, a technique of covering the organic EL elements with a sealing film in order to prevent organic EL elements from deteriorating due to moisture and the like that enters from the outside is known. In a case where such an organic EL display device is bent, there is a possibility that cracks are generated in the sealing film due to film stress, and moisture and the like intrudes therethrough, whereby the organic EL elements deteriorate.

Patent Document 1 discloses a configuration of a display device wherein, on organic EL elements formed on a first substrate, an inorganic insulating film (sealing film) is formed, and a second substrate is formed on the inorganic insulating film. In the display device, in order to prevent cracks from being generated in the sealing film due to bending stress, the materials and thicknesses of the first substrate and the second substrate are set so that the neutral axis, which is the intermediate axis of the display device in the thickness direction, is positioned in the vicinity of the interface between the inorganic insulating film and the second substrate when bending stress is applied.

PRIOR ART DOCUMENT

Patent Document

Patent Document 1: WO2005/027582

SUMMARY OF THE INVENTION

Problem to be Solved by the Invention

In the case of the method disclosed in Patent Document 1, however, since the thicknesses and materials of the first substrate and the second substrate are set so that the neutral axis coincides with the inorganic insulating film (sealing film) when bending stress is applied, the overall thickness of the display device increases, which degrades the flexibility of the display device.

It is an object of the present invention to provide a display device configured so that the display panel is hardly damaged when the display device is bent, without decrease of the flexibility of the display device.

Means to Solve the Problem

A display device in one embodiment of the present invention includes a display panel having flexibility, and an optical member arranged so as to be stacked on the display panel, wherein the display panel and the optical member are stacked and bonded in a bent state, and thereafter stretched into a flat shape.

Effect of the Invention

According to the present disclosure, the display panel and the optical member are stacked and bonded in a bent state, and thereafter stretched into a flat shape. Therefore, even when the display device is bent, accumulated stress of each layer does not occur to the bent part, and the display panel is hardly damaged.

MODE FOR CARRYING OUT THE INVENTION

Figure 1:
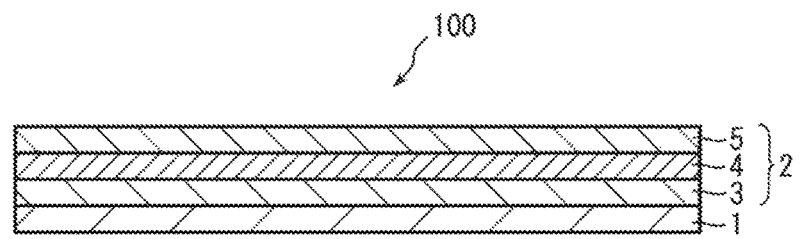
FIG. 1 illustrates a configuration of a display device in Embodiment 1.

A display device in one embodiment of the present invention includes: a display panel having flexibility; and an optical member arranged so as to be stacked on the display panel, wherein the display panel and the optical member are stacked and bonded in a bent state, and thereafter stretched into a flat shape (the first configuration).

According to the first configuration, the display panel and the optical member are stacked and bonded in a bent state, and thereafter stretched into a flat shape. Even when, therefore, the display device is bent, accumulated stress of each layer does not occur in the bent portion, and the display panel is hardly damaged.

In the first configuration, the display panel includes a moisture-proof layer that has a moisture-proof function and a sealing film, and the moisture-proof layer and the sealing film are formed on an outer side with respect to a midpoint, in the thickness direction, between a neutral axis of the display device and an outer surface of the display device (the second configuration).

In the case of the second configuration, even in a configuration in which the moisture-proof layer and the sealing film of the display panel are formed on an outer side with respect to a midpoint, in the thickness direction, between a neutral axis of the display device and an outer surface thereof, accumulated stress of each layer does not occur in the bent portion even when the display device is bent. Therefore, damage can be prevented from occurring to the moisture-proof layer and the sealing film.

A bonding jig used for manufacturing the display device according to the first or second configuration has: a first flat surface; a second flat surface opposed to the first flat surface; and a curved surface extended between the first flat surface and the second flat surface, wherein the first flat surface, the curved surface, and the second flat surface are used when the display panel and the optical member are bonded along these surfaces (the third configuration).

With the third configuration, the display panel and the optical member can be easily stacked and bonded in a bent state.

A bonding device used for manufacturing the display device according to the first or second configuration includes: an outer roller that is rotationally movable; and an inner roller that is rotationally movable, wherein the outer roller and the inner roller rotationally move in a state in which the display panel and the optical member are interposed therebetween, so that the display panel and the optical member are bent in a desired shape (the fourth configuration).

With the fourth configuration, the display panel and the optical member can be easily stacked and bonded in a bent state.

A stretching jig used for manufacturing the display device according to the first or second configuration includes: a first surface part; a second surface part; and a connection part that connects the first surface part and the second surface part, wherein the first surface part and the second surface part are turnable via the connection part, and the display panel and the optical member stacked and bonded in a bent state are arranged between the first surface part and the second surface part arranged so as to be opposed to each other, and at least one of the first surface part and the second surface part is turned so that the first surface part and the second surface part become level with each other, in a state in which ends on one side of the display panel and the optical member are fixed to the first surface part, and ends on the other side of the display panel and the optical member are fixed to the second surface part, so that the display panel and the optical member are stretched into a flat shape, with tensile stress being applied to thereto (the fifth configuration).

With the fifth configuration, the display panel and the optical member stacked and bonded in a bent state can be stretched into a flat shape, without the occurrence of a recess in the bent portion.

A method for manufacturing a display device in one embodiment of the present invention includes the steps of: stacking and bonding a display panel having flexibility, and an optical member arranged so as to be stacked on the display panel, in a bent state; and stretching the display panel and the optical member, which are stacked and bonded in a bent state, into a flat shape (the sixth configuration).

According to the sixth configuration, the display panel and the optical member are stretched into a flat shape after being stacked and bonded in a bent state. Even in a case where the display device is bent, therefore, accumulated stress of each layer does not occur in the bent portion, and the display panel is hardly damaged.

Embodiment

The following describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios.

Embodiment 1

FIG. 1 illustrates a configuration of a display device in the present embodiment. The display device 100 in the present embodiment includes an organic EL panel 1 that is one kind of a display panel, and an optical member 2 arranged so as to be stacked on the organic EL panel 1. The optical member 2 includes a polarizing plate 3, a touch panel 4, and a hard coat 5. Each of the polarizing plate 3, the touch panel 4, and the hard coat 5 has flexibility. In the present description of the specification, a member that composes the display device 100 together with the display panel having a function of displaying images and video images, and that has a function of allowing light to pass therethrough, to be reflected thereon, and the like, is referred to as an optical member.

Figure 2:
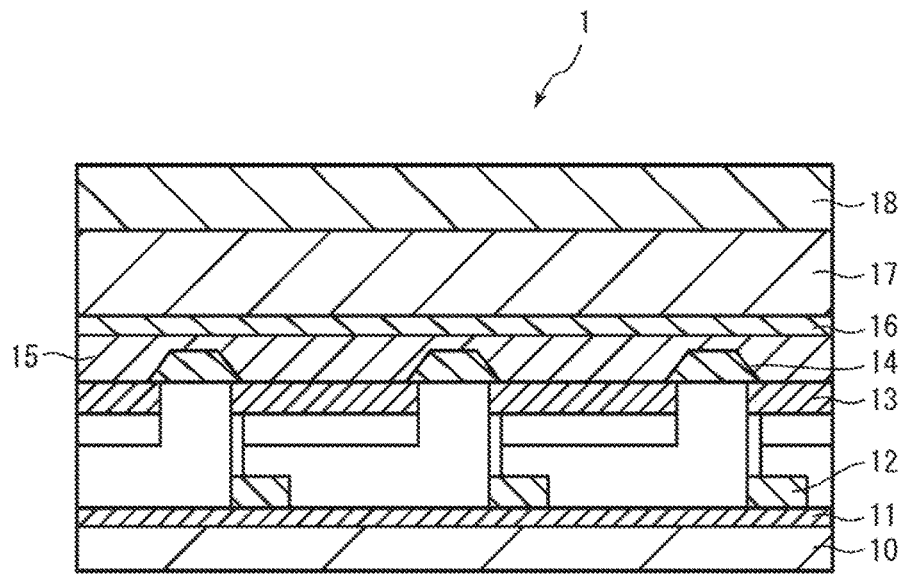
FIG. 2 is a diagram for explaining a configuration of an organic EL panel.

FIG. 2 is a diagram for explaining a configuration of the organic EL panel 1. The organic EL panel 1 has flexibility, and includes a TFT substrate 10, a moisture-proof layer 11, TFTs 12, first electrodes 13, an edge cover 14, an organic EL layer 15, a second electrode 16, a sealing film 17, and a counter substrate 18.

The TFT substrate 10, which is a flexible substrate, is in a sheet form and has flexibility, being formed with, for example, plastic or polyimide resin.

The moisture-proof layer 11, having a moisture-proof function, is formed by repeatedly laminating a combination of, for example, SiNx with a thickness of 0.2 µm and SiOn with a thickness of 0.2 µm on the TFT substrate 10.

The TFTs 12 function as switching elements that control light emission of the organic EL elements of respective colors of red (R), green (G), and blue (B).

A plurality of the first electrodes 13 are formed at predetermined intervals in matrix, and each of the first electrodes 13 forms each pixel region of the organic EL panel 1.

The organic EL layer 15 is formed on the first electrode 13, and the second electrode 16 is formed on the organic EL layer 15.

The edge cover 14 is formed so as to cover ends of the first electrodes 13. The edge cover 14 is an insulating layer for preventing the first electrode 13 and the second electrode 16 from being short-circuited in a case where the organic EL layer 15 is thinned or electric field concentration occurs at an end of the first electrode 13. Openings in the edge cover 14, that is, portions where the first electrodes 13 are exposed, are light emission areas of the respective pixels.

Either of the first electrode 13 and the second electrode 16 is an anode, and the other of the same is a cathode. In a case where the first electrode 13 is an anode and the second electrode 16 is a cathode, the first electrodes 13 are a layer for injecting (supplying) holes to the organic EL layer 15, and the second electrode 16 is a layer for injecting electrons to the organic EL layer 15. In this case, the organic EL layer 15 includes a hole injection layer, a hole transport layer, a light emission layer, an electron transport layer, and an electron injection layer in this order from the first electrode 13 side.

The hole injection layer is a layer having a function of enhancing the efficiency of hole injection with respect to the organic EL layer 15.

The hole transport layer is a layer having a function of enhancing the efficiency of hole transport with respect to the light emission layer.

The light emission layer is a layer having a function of recombining the holes injected from the first electrode 13 side and the electrons injected from the second electrode 16 side thereby emitting light, and emits any of red color light, green color light, and blue color light. The light emission layer may have a configuration of emitting white light by combining red color light, green color light, and blue color light.

The electron transport layer is a layer having a function of enhancing the efficiency of electron transport from the second electrode 16 to the light emission layer.

The electron injection layer is a layer having a function of enhancing the efficiency of electron injection from the second electrode 16 to the organic EL layer 15.

The above-described layers that compose the organic EL layer 15 may be configured so that a single layer has two or more functions (for example, the hole injection layer may double as the hole transport layer). Further, the organic EL layer 15 may include another layer such as a carrier blocking layer, as required. For example, by adding a hole blocking layer as a carrier blocking layer between the light emission layer and the electron transport layer, holes can be prevented from passing therethrough to the electron transport layer, whereby the light emission efficiency can be enhanced.

In the foregoing description, the first electrode 13 is an anode and the second electrode 16 is a cathode, but the configuration may be such that the first electrode 13 is a cathode and the second electrode 16 is an anode. In this case, the order in which the layers composing the organic EL layer 15 are laminated is reversed.

The entirety of the organic EL layer 15 and the second electrode 16 is covered with the sealing film 17. The sealing film 17, having the moisture-proof function, is provided so as to prevent moisture or oxygen from intruding from the outside. With film exfoliation due to film stress and the like taken into consideration, organic substances and inorganic substances are laminated, whereby excellent moistureproofness is achieved, while film stability is ensured. The sealing film 17 is formed by repeatedly laminating a combination of, for example, SiNx with a thickness of 0.5 μm and SiCN with a thickness of 0.5 μm.

The counter substrate 18, which is a flexible substrate, is in a sheet form and has flexibility, being formed with, for example, plastic or polyimide resin.

The polarizing plate 3 has a function of absorbing light having a particular polarization direction, and allowing light having a polarization direction rotated by a predetermined angle (for example, 90 degrees) with respect to the foregoing polarization direction to pass therethrough. In particular, in a case where the polarizing plate 3 is used together with the organic EL panel 1, the polarizing plate 3 is combined with a retarder (¼λ plate) so as to be used as a circularly polarizing plate. This makes it possible to reduce reflection light caused by metal lines and the like, thereby improving visibility in a bright place such as the outdoors.

The polarizing plate 3 has, for example, a three-layer structure composed of a top surface film, a polarization layer, and a retarder (¼λ plate). To form the top surface film, for example, triacetyl cellulose (TAC) is used. To form the polarization layer, for example, polyvinyl alcohol (PVA) is used. To form the retarder, for example, a norbornene-based resin or the like is used.

PVA is dyed with iodine, and thereafter is uniaxially stretched. PVA absorbs polarized light that is parallel with the stretching direction, and allows polarized light that is perpendicular to the stretching direction to pass therethrough. The retarder has a function of giving a phase difference to light having passed through the polarizing plate, and converts light having passed through the polarizing plate into circularly polarized light, by the phase difference design (¼λ condition). When the circularly polarized light is reflected at metals and the like (for example, the lines in the organic EL panel 1), the rotation direction of the polarized light is reversed (reverse circularly polarized light), and in a case where the polarized light reaches the polarizing plate after the polarized light is reflected and again passes through the retarder, the light is allowed to have polarization twisted by 90 degrees with respect to the state upon the incidence. Since light having polarization twisted by 90 degrees is absorbed by the polarizing plate, unnecessary reflection of external light can be effectively reduced, and visibility in a bright place such as the outdoors can be drastically improved.

The touch panel 4 has, for example, such a configuration that lines (transparent conductors such as metals or indium tin oxide (ITO)) are arranged in matrix on both surfaces of a polyethylene terephthalate (PET) film. By applying a high frequency signal to the above-described lines formed in matrix, and detecting changes in voltage waveforms caused by capacity coupling between the lines and a user's finger or a pen for a touch panel, a touched position on the surface of the display device 100 can be detected.

The hard coat 5 is a hard film for protecting the surface of the display device 100, and the configuration thereof may be, for example, such that an acrylic resin film is formed on a PET film or a TAC film as a base film.

The display device 100 in the present embodiment is formed by stacking and bonding the organic EL panel 1 and the optical member 2 in a bent state, and stretching the same into a flat shape.

Figures 3, 4:
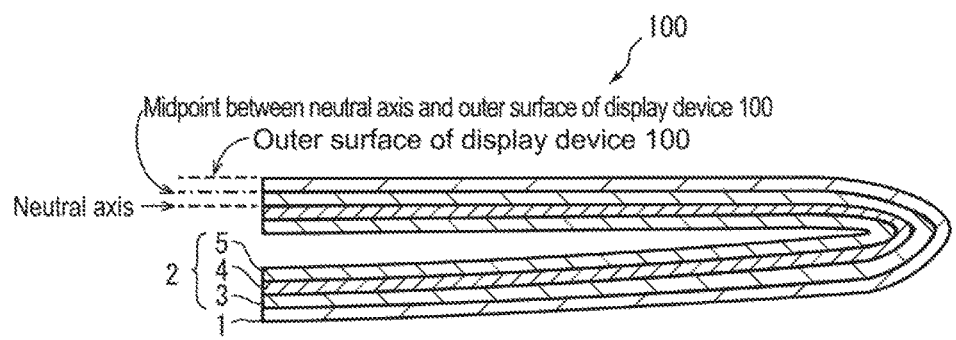
FIG. 3 illustrates a state in which the organic EL panel and the optical member are stacked and arranged in a bent state.
FIG. 4 illustrates results of simple experiments for confirming whether or not damage to organic EL panels was recognized after a bending test was performed ten thousand times with respect to products obtained by bonding one of PEN films having five different thicknesses and an organic EL panel in a flat state (flat bonding), and products obtained by bonding the same in a bent state (bent bonding).

FIG. 3 illustrates the organic EL panel 1 and the optical member 2 stacked and bonded in a bent state. In a case where the organic EL panel 1 and the optical member 2 are bonded in a flat state as is conventionally done, as the optical member 2 has a greater thickness, in a bent state, greater tensile stress accumulated from the optical member 2 is exerted on the organic EL panel 1, which is formed on an outer side of the bent portion with respect to the neutral axis, which is an intermediate axis in the thickness direction of the display device 100. In a case where the organic EL panel 1 and the optical member 2 are stacked and bonded in a bent state as is the case with the present embodiment, only compressive stress and tensile stress caused by the organic EL panel 1 and the optical member 2 themselves occur to the bent portion of the organic EL panel 1 and the optical member 2. The moisture-proof layer 11 and the sealing film 17 of the organic EL panel 1 may be formed on an outer side with respect to the midpoint between the neutral axis of the display device 100 and the outer surface of the display device 100.

The inventor of the present invention carried out an experiment for confirming effects in a case where the organic EL panel 1 and the optical member 2 are stacked and bonded in a bent state. In this experiment as a simple experiment, a polyethylene naphthalate (PEN) film was bonded with an adhesive to the top surface of the organic EL panel 1, and a bending test was carried out ten thousand times at a bending radius R of 3 mm.

PEN films of five different thickness of 40 μm, 60 μm, 110 μm, 140 μm, and 160 μm were used. The thickness of adhesive used for bonding the organic EL panel 1 and the PEN film was 25 μm.

Regarding each of cases where any of the above-described PEN films of 5 different thicknesses and the organic EL panel 1 were bonded in a flat state (flat bonding) and cases where any of the PEN films and the organic EL panel 1 were bonded in a bent state (bent bonding), a bending test was carried out ten thousand times, and thereafter, it was confirmed whether or not the organic EL panel 1 was damaged.

FIG. 4 is a diagram showing the results of the above-described simple experiments. In FIG. 4, "○" indicates that no damage to the organic EL panel 1 was recognized after the bending test was carried out ten thousand times, "×" indicates that damage to the organic EL panel 1 was recognized after the bending test was carried out ten thousand times, and "××" indicates that damage to the organic EL panel 1 by carrying out the bending test once was recognized.

As shown in FIG. 4, in the case of flat bonding, in the case where the PEN film of 40 μm was bonded and the case where the PEN film of 60 μm was bonded, no damage to the organic EL panel 1 was recognized even if the bending test was carried out ten thousand times, but in the case where the PEN film of 110 μm was bonded, damage to the organic EL panel 1 was recognized after the bending test was carried out ten thousand times. Further, in the case where the PEN film of 140 μm was bonded and the case where the PEN film of 160 μm was bonded, damage to the organic EL panel 1 by carrying out the bending test once was recognized.

On the other hand, in the case of bent bonding where the PEN film and the organic EL panel 1, both in a bent state, were bonded with each other, in any of the cases where the PEN films having 5 different thicknesses were used, no damage to the organic EL panel 1 was recognized after the bending test was carried out ten thousand times.

(Method for Bonding Organic EL Panel and Optical Member)

Figure 5A:
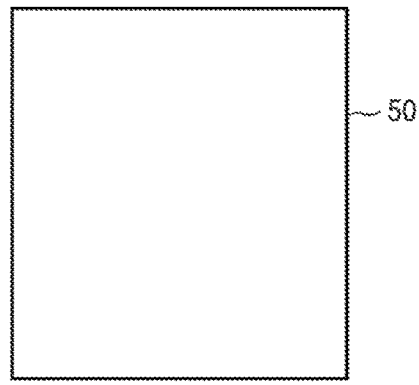
FIG. 5A is a top view illustrating a bonding jig for bonding an organic EL panel and an optical member.
Figure 5B:
FIG. 5B is a side view of the bonding jig.

FIG. 5A is a top view illustrating a bonding jig 50 for bonding the organic EL panel 1 and the optical member 2, and FIG. 5B is a side view of the bonding jig 50. The bonding jig 50 is generally in a flat plate shape, and has a top surface that is a first flat surface, a lower surface that is a second flat surface opposed to the first flat surface, and a curved surface extended between the first flat surface and the second flat surface. The curved surface may be in a semi-circular arc shape having a predetermined radius, or may be in a semi-elliptical shape.

Figure 6:
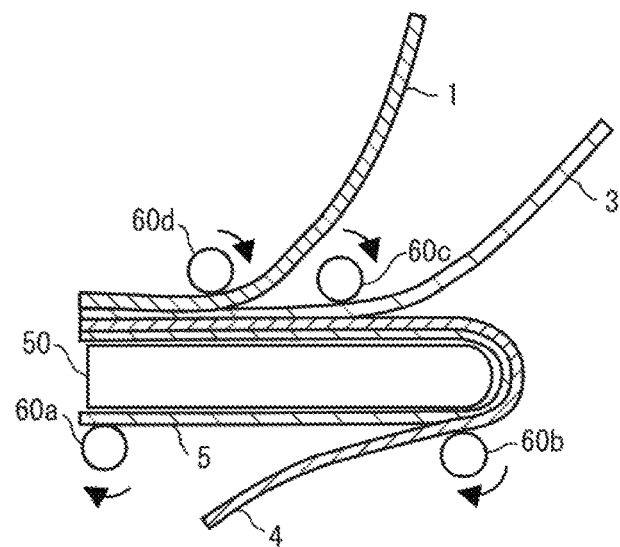
FIG. 6 is a diagram for explaining a method for bonding an organic EL panel and an optical member by using the bonding jig.

FIG. 6 is a diagram for explaining a method for bonding the organic EL panel 1 and the optical member 2 by using the bonding jig 50. The organic EL panel 1 and the polarizing plate 3 are bonded with an adhesive, and so are the polarizing plate 3 and the touch panel 4, as well as the touch panel 4 and the hard coat 5.

First of all, the hard coat 5 is caused to adhere to the bonding jig 50, along the top surface, the curved surface, and the lower surface of the bonding jig 50. More specifically, the hard coat 5 is placed on the top surface of the bonding jig 50, and a roller 60*a* is rolled over the hard coat 5 along the shape of the bonding jig 50, whereby the hard coat 5 is caused to adhere to the bonding jig 50.

Subsequently, the touch panel 4 is placed on the top surface of the hard coat 5, and the roller 60*b* is rolled over the touch panel 4, along the shape of the bonding jig 50, whereby the touch panel 4 is caused to adhere to the hard coat 5.

Subsequently, the polarizing plate 3 is placed on the top surface of the touch panel 4, and the roller 60*c* is rolled over the polarizing plate 3 along the shape of the bonding jig 50, whereby the polarizing plate 3 is caused to adhere to the touch panel 4.

Finally, the organic EL panel 1 is placed on the top surface of the polarizing plate 3, and the roller 60*d* is rolled over the organic EL panel 1 along the shape of the bonding jig 50, whereby the organic EL panel 1 is caused to adhere to the polarizing plate 3.

In FIG. 6, four rollers 60*a* to 60*d* are illustrated, but one roller may be repeatedly used (in the example illustrated in FIG. 6, four times). Further, the bonding can be carried out by using something other than the rollers.

(Method for Stretching Display Device)

Figure 7:
FIG. 7 illustrates a state in which a display device produced by bonding an organic EL panel and an optical member in a bent state is simply unfolded into a flat shape.
Figure 8:
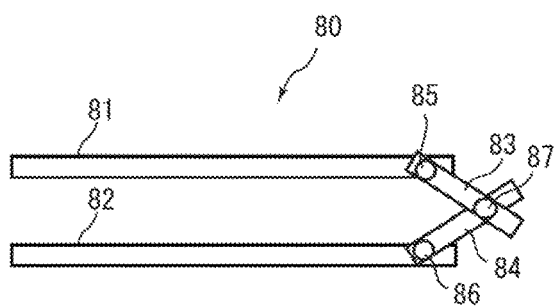
FIG. 8 illustrates an exemplary form of a stretching jig for stretching a display device produced by bonding an organic EL panel and an optical member in a bent state.

When the display device 100 produced by bonding the organic EL panel 1 and the optical member 2 in a bent state is simply unfolded into a flat shape, the most bent part is recessed, as illustrated in FIG. 7. In the present embodiment, therefore, by using a stretching jig 80 illustrated in FIG. 8, the display device 100 is stretched into a flat shape.

The stretching jig 80 includes a first surface part 81, a second surface part 82, a first connection part 83, and a second connection part 84. The first surface part 81 and the first connection part 83 are connected by a first movable part 85, and the second surface part 82 and the second connection part 84 are connected by a second movable part 86. The first surface part 81 and the first connection part 83 are turnable around the first movable part 85 as the center. Further, the second surface part 82 and the second connection part 84 are turnable around the second movable part 86 as the center.

The first connection part 83 and the second connection part 84 are connected at a fixing part 87. The angle formed between the first connection part 83 and the second connection part 84 is therefore unchangeable.

In the above-described configuration, the first connection part 83 and the second connection part 84 constitutes a connection part that connects the first surface part 81 and the second surface part 82. The first connection part 83 and the second connection part 84 may be integrally provided to form one connection part.

Figure 9A:
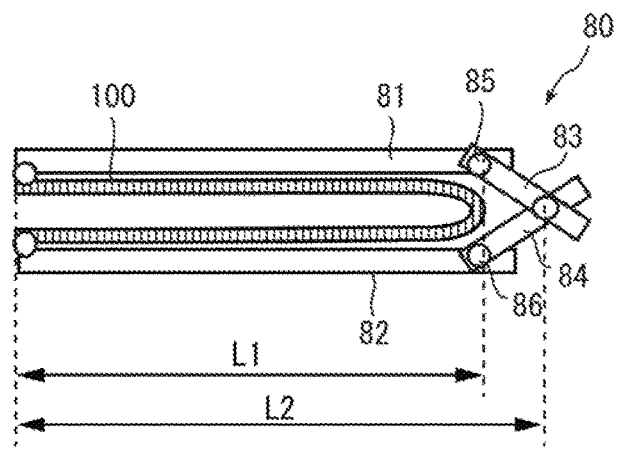
FIG. 9A is a side view illustrating a state in which a display device in a bent state is set in the stretching jig.
Figure 9B:
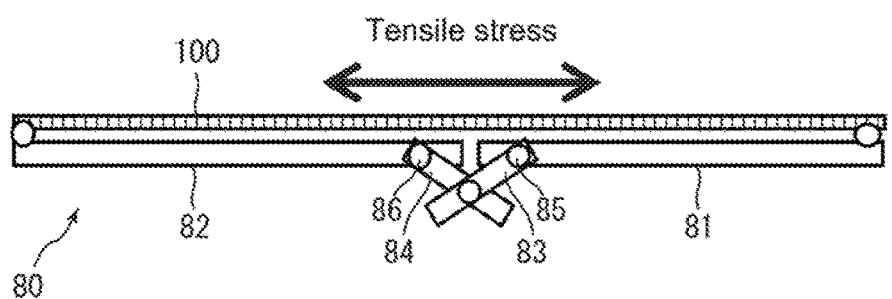
FIG. 9B is a side view illustrating a state in which the display device is stretched into a flat shape by the stretching jig.

FIGS. 9A and 9B are diagrams for explaining a method for stretching the display device 100 by using the stretching jig 80. FIG. 9A is a side view illustrating a state in which the display device 100 in a bent state is set on the stretching jig 80, and FIG. 9B is a side view illustrating a state in which the device 100 is stretched into a flat shape by the stretching jig 80.

It is assumed that, as illustrated in FIG. 9A, the relationship of L2>L1 is satisfied, where "L1" represents a distance from an end of the display device 100 in the bent state to the bent portion, and "L2" represents a distance from an end of the first surface part 81 (or the second surface part 82) of the stretching jig 80 to the fixing part 87.

The following describes a method for stretching the display device 100. First of all, as illustrated in FIG. 9A, the display device 100 in the bent state is placed between the first surface part 81 and the second surface part 82 of the stretching jig 80, which are arranged so as to be opposed to each other, and the end of the top surface of the display device 100 in the bent state is fixed to the end of the first surface part 81 of the stretching jig 80, while the end of the lower surface of the display device 100 is fixed to the end of the second surface part 82 of the stretching jig 80.

In FIG. 9A, the ends of the display device 100 in the bent state, and the ends of the surface parts 81, 82 of the stretching jig 80 coincide with each other. In a case where they do not coincide, however, the configuration may be such that the end of the top surface of the display device 100 is fixed at the closest position in the first surface part 81 of the stretching jig 80, and the end of the lower surface of the display device 100 is fixed at the closest position in the second surface part 82 of the stretching jig 80.

Next, as illustrated in FIG. 9B, the first surface part 81 is turned so as to be opened, around the second movable part 86 as a fulcrum, so that the first surface part 81 and the second surface part 82 become level with each other. Here, the end portions of the display device 100 remain fixed at the end portion of the first surface part 81 and the end portion of the second surface part 82. This causes tensile stress to occur in the horizontal direction of the display device 100 when the first surface part 81 is turned, and hence, no recess occurs at the bent position of the display device 100, whereby the display device 100 can be stretched into a flat shape.

In a state in which the display device 100 is stretched into a flat shape, tensile stress occurs to the hard coat 5, which is arranged on the inner side in a bent state, and compressive stress occurs to the organic EL panel 1 arranged on the outer side. Breakage of the moisture-proof layer 11 and the sealing film 17 in the organic EL panel 1 occurs due to tensile stress, and does not occur due to compressive stress. Even if, therefore, the organic EL panel 1 bonded in a bent state is stretched into a flat shape, the moisture-proof layer 11 and the sealing film 17 in the organic EL panel 1 do not break.

It should be noted that, from the state illustrated in FIG. 9A, the second surface part 82 may be turned so as to be opened, around the first movable part 85 as a fulcrum, so that the first surface part 81 and the second surface part 82 become level with each other.

Embodiment 2

In Embodiment 1, by using the bonding jig 50 illustrated in FIGS. 5A and 5B, the organic EL panel 1 and the optical member 2 are bonded. In Embodiment 2, as the bonding device, a pair of bonding rollers 101 composed of an outer roller 101a and an inner roller 101b are used to bond the organic EL panel 1 and the optical member 2.

Figure 10:
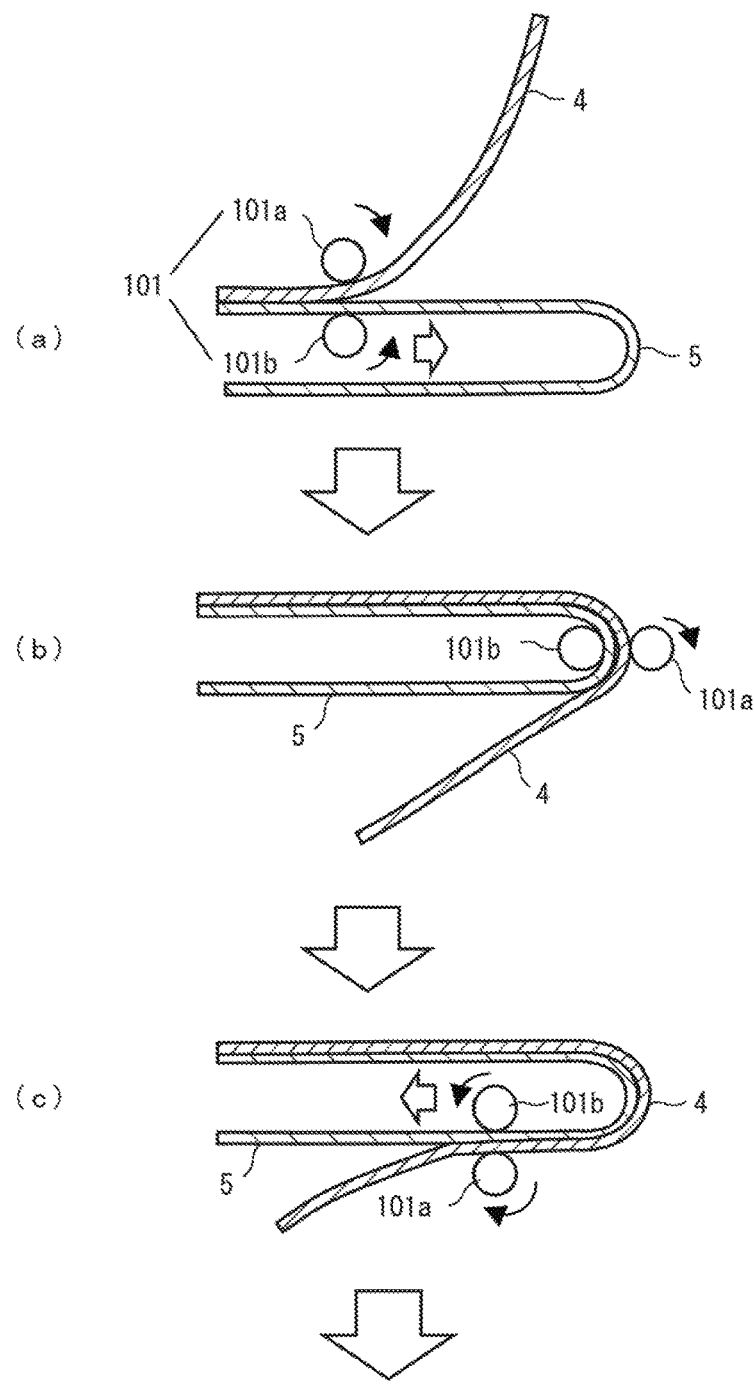
FIG. 10 is a diagram for explaining a method for bonding an organic EL panel and an optical member by using a pair of bonding rollers.

FIG. 10 is a diagram for explaining a method for bonding the organic EL panel 1 and the optical member 2 by using the pair of bonding rollers 101. In FIG. 10, (a) illustrates a state in which the touch panel 4 is bonded to the top surface of the hard coat 5 folded into two. In FIG. 10, (b) illustrates a state in which the touch panel 4 is bonded to the bent portion of the hard coat 5, and (c) illustrates a state in which the touch panel 4 is bonded to the lower surface of the hard coat 5 in the bent state.

In order to bond the organic EL panel 1 and the optical member 2, the hard coat 5 and the touch panel 4 are bonded first.

In order to bond the hard coat 5 and the touch panel 4, first of all, the hard coat 5 is fixed in a bent state, being folded into two, and respective ends of the touch panel 4 and the hard coat 5 are stacked on each other so that the touch panel 4 is bonded onto the top surface of the hard coat 5 thus bent. Then, as illustrated in (a) of FIG. 10, the pair of bonding rollers 101 composed of the outer roller 101a and the inner roller 101b are moved in a bonding direction, in a state in which the hard coat 5 and the touch panel 4 are interposed between the pair of bonding rollers 101.

Here, the outer roller 101a and the inner roller 101b are controlled so as to move at the same speed. In a case where the diameter of the outer roller 101a and the diameter of the inner roller 101b are equal to each other, the rotation speeds of the outer roller 101a and the inner roller 101b may be equal to each other, so that the outer roller 101a and the inner roller 101b move at the same speed.

In a case where the touch panel 4 is bonded to the bent portion, that is, the curved surface portion, of the hard coat 5 (see (b) of FIG. 10), the moving speed of the inner roller 101b is made slower, with respect to the moving speed of the outer roller 101a. This is because the distance through which the inner roller 101b moves on the inner side of the bent portion of the hard coat 5 is shorter than the distance through which the outer roller 101a moves on the outer side of the bent portion of the hard coat 5. In other words, when the bonding of the touch panel 4 is started on the lower surface of the hard coat 5, the moving speeds of the outer roller 101a and the inner roller 101b are adjusted so that the positions of the outer roller 101a and the inner roller 101b coincide with each other in the vertical direction. Further, the outer roller 101a and the inner roller 101b are rotationally moved so that the touch panel 4 and the hard coat 5 are bent in a desired shape.

Finally, as illustrated in (c) of FIG. 10, the outer roller 101a and the inner roller 101b are moved at the same speed so that the touch panel 4 is bonded on the lower surface of the hard coat 5.

Through the above-described steps, the touch panel 4 is bonded onto the hard coat 5. After this, the polarizing plate 3 is bonded onto the outer side of the touch panel 4 through identical steps. Further, after the bonding of the polarizing plate 3, the organic EL panel 1 is bonded on the outer side of the polarizing plate 3.

It should be noted that the bending radius of the bent portion can be adjusted by adjusting the diameter of the inner roller 101b and the rotation speed (progression speed).

The present invention is not limited to the above-described embodiment. For example, in the description, the organic EL panel 1 is taken as one example of the display panel, but the display panel may be anything as long as it is a display panel having flexibility, and may be, for example, an electrophoretic display, or a liquid crystal display including a flexible substrate.

The polarizing plate 3, the touch panel 4, and the hard coat 5 are taken as exemplary optical members, but the optical members are not limited to these.

The display devices in the above-described embodiments are applicable to a variety of displays such as a television set, a smartphone, a tablet terminal, a game machine, and the like.

DESCRIPTION OF REFERENCE NUMERALS

1 . . . organic EL panel
2 . . . optical member
3 . . . polarizing plate
4 . . . touch panel
5 . . . hard coat
50 . . . bonding jig
80 . . . stretching jig 101 . . . a pair of bonding rollers
101*a* . . . outer roller
101*b* . . . inner roller

The invention claimed is:

1. A method for manufacturing a display device, the method comprising:
stacking and bonding a display panel having flexibility, and an optical member arranged so as to be stacked on the display panel, in a bent state; and
stretching the display panel and the optical member, which are stacked and bonded in a bent state, into a flat shape, wherein
the bonding of the display panel and the optical member includes attaching the display panel, at a bent portion of the display panel and the optical member, to an outer surface of the optical member in a direction of radius of curvature,
the stretching of the display panel and the optical member is carried out by using a stretching jig, the stretching jig having:
a first surface part;
a second surface part; and
a connection part that connects the first surface part and the second surface part,
wherein the first surface part and the second surface part are turnable via the connection part, and
wherein, at the stretching of the display panel and the optical member, the display panel and the optical member stacked and bonded in a bent state are arranged between the first surface part and the second surface part arranged so as to be opposed to each other, and at least one of the first surface part and the second surface part is turned so that the first surface part and the second surface part become level with each other, in a state in which ends on one side of the display panel and the optical member are fixed to the first surface part, and ends on the other side of the display panel and the optical member are fixed to the second surface part, so that the display panel and the optical member are stretched into a flat shape, with tensile stress being applied to thereto.

2. The method according to claim 1, wherein
the optical member includes a hard coat, a touch panel and a polarizing plate;
the bonding of the display panel and the optical member includes, attaching the touch panel to the hard coat and attaching the polarizing plate to the touch panel; the touch panel being attached, at a bent portion of the hard coat and the touch panel, to an outer surface of the hard coat in a direction of radius of curvature; and the polarizing plate being attached, at a bent portion of the touch panel and the polarizing plate, to an outer surface of the touch panel in a direction of radius of curvature.

3. The method according to claim 1, further including:
forming the display panel by forming a TFT substrate; forming an organic electroluminescence element; and forming a sealing film;
wherein the display panel is bonded to the optical member such that the sealing film is arranged, at the bent portion of the display panel and the optical member, on an outer side in a direction of radius of curvature with respect to a midpoint between a neutral axis of the display device in the thickness direction and an outer surface of the display device.

4. The method according to claim 1, wherein
the bonding of the display panel and the optical member includes:
attaching the optical member to a bonding jig along a shape of the bonding jig; and
attaching the display panel to the optical member along the shape of the bonding jig.

5. The method according to claim 4, wherein
the bonding jig has:
a first flat surface;
a second flat surface opposed to the first flat surface; and
a curved surface extended between the first flat surface and the second flat surface,
wherein
the optical member is attached to the bonding jig along the first flat surface, the second flat surface and the curved surface; and
the display panel is attached to the optical member along the first flat surface, the second flat surface and the curved surface.

6. The method according to claim 1, wherein
the bonding of the display panel and the optical member is carried out by using a bonding device, the bonding device having:
an outer roller that is rotationally movable; and
an inner roller that is rotationally movable,
wherein, at the bonding of the display panel and the optical member, the outer roller and the inner roller rotationally move in a state in which the display panel and the optical member are interposed therebetween, so that the display panel and the optical member are bent in a desired shape.

7. The method according to claim 6, wherein,
the bonding of the display panel and the optical member includes:
causing the outer roller and the inner roller to move at a same speed;
causing the outer roller and the inner roller to move, at the bent portion of the display panel and the optical member, such that a moving speed of the inner roller is lower than a moving speed of the outer roller; and
causing the outer roller and the inner roller to move at a same speed.

* * * * *